US008547043B2

(12) United States Patent
Kuroda

(10) Patent No.: US 8,547,043 B2
(45) Date of Patent: Oct. 1, 2013

(54) MOTOR CONTROL DEVICE AND ELECTRIC POWER STEERING EQUIPMENT HAVING THE SAME

(75) Inventor: Yoshihide Kuroda, Obu (JP)

(73) Assignee: Denso Corporation, Kariya (JP)

( * ) Notice: Subject to any disclaimer, the term of this patent is extended or adjusted under 35 U.S.C. 154(b) by 90 days.

(21) Appl. No.: 13/332,993

(22) Filed: Dec. 21, 2011

(65) Prior Publication Data

US 2012/0161681 A1 Jun. 28, 2012

(30) Foreign Application Priority Data

Dec. 27, 2010 (JP) ................................. 2010-289219

(51) Int. Cl.
*H02P 6/12* (2006.01)

(52) U.S. Cl.
USPC ............... 318/400.21; 318/400.3; 318/432; 361/18; 701/41

(58) Field of Classification Search
USPC ............... 318/400.21, 400.3, 432; 361/18; 701/41
See application file for complete search history.

(56) References Cited

U.S. PATENT DOCUMENTS

| 6,426,608 | B2 * | 7/2002 | Amano et al. | 320/163 |
|---|---|---|---|---|
| 6,960,903 | B2 * | 11/2005 | Yamamoto | 323/282 |
| 6,987,371 | B2 * | 1/2006 | Kifuku | 318/432 |
| 7,294,985 | B2 * | 11/2007 | Kifuku | 318/432 |
| 7,514,889 | B2 * | 4/2009 | Kifuku | 318/432 |
| 7,589,940 | B2 * | 9/2009 | Sawano et al. | 361/18 |
| 7,863,845 | B2 * | 1/2011 | Kasai et al. | 318/440 |
| 8,049,363 | B2 * | 11/2011 | McLean et al. | 307/48 |
| 8,148,934 | B2 * | 4/2012 | Ogasawara | 318/727 |
| 8,159,166 | B2 * | 4/2012 | Koike | 318/400.21 |
| 8,350,510 | B2 * | 1/2013 | Ogasawara | 318/400.3 |
| 8,380,399 | B2 * | 2/2013 | Fujimoto | 701/41 |
| 2003/0011334 | A1 * | 1/2003 | Kifuku | 318/432 |
| 2005/0024032 | A1 * | 2/2005 | Yamamoto | 323/282 |
| 2005/0092541 | A1 * | 5/2005 | Kifuku | 180/443 |
| 2007/0235249 | A1 * | 10/2007 | Kifuku | 180/446 |
| 2008/0094866 | A1 * | 4/2008 | Bauman et al. | 363/50 |

(Continued)

FOREIGN PATENT DOCUMENTS

| JP | 10-341140 | 12/1998 |
|---|---|---|
| JP | 2007-145208 | 6/2007 |
| JP | 2007-276706 | 10/2007 |
| JP | 2010-074915 | 4/2010 |

OTHER PUBLICATIONS

Office Action issued Dec. 7, 2012 in corresponding Japanese Application No. 2010-289219 with English translation.

*Primary Examiner* — Paul Ip
(74) *Attorney, Agent, or Firm* — Harness, Dickey & Pierce, PLC

(57) ABSTRACT

A motor control device detecting short-circuit and disconnection faults of a power relay includes: a drive circuit of a motor; the power relay having first and second switching elements; a capacitor; a voltage detector detecting a voltage of the first switching element; a charger charging the capacitor; and a controller detects a short-circuit fault of the first and second switching elements according to the detection voltage when the first and second switching elements turn off after the charger charges the capacitor, detects a disconnection fault of the second switching element according to the detection voltage when the first switching element turns off, and the second switching element turns on and detects a disconnection fault of the first switching element according to the detected voltage when the first switching element turns on, and the second switching element turns off.

6 Claims, 3 Drawing Sheets

(56) References Cited

U.S. PATENT DOCUMENTS

| | | | |
|---|---|---|---|
| 2009/0183714 A1* | 7/2009 | Mayuzumi | 123/490 |
| 2009/0218967 A1* | 9/2009 | McLean et al. | 318/400.3 |
| 2010/0109588 A1* | 5/2010 | Koike | 318/400.21 |
| 2010/0181946 A1* | 7/2010 | Ogasawara | 318/139 |
| 2011/0012424 A1* | 1/2011 | Wortberg et al. | 307/10.1 |
| 2011/0098887 A1* | 4/2011 | Fujimoto | 701/41 |
| 2011/0127936 A1* | 6/2011 | Ogasawara | 318/400.3 |
| 2011/0156626 A1* | 6/2011 | Mukai et al. | 318/400.21 |
| 2011/0163708 A1* | 7/2011 | Mukai et al. | 318/722 |
| 2011/0204839 A1* | 8/2011 | Mukai et al. | 318/724 |
| 2011/0205672 A1* | 8/2011 | Sakai | 361/18 |

\* cited by examiner

FIG. 3

| | 1ST FET | 2ND FET | DET NODE | DECISION → NORMAL | 1ST FET SHORT CIR | 2ND FET SHORT CIR | 1ST FET DISCON | 2ND FET DISCON |
|---|---|---|---|---|---|---|---|---|
| STEP1 | OFF | OFF | P1 | 0 | Vb | Vc | UNDECIDED | UNDECIDED |
| | | | P2 | Vc | Vb' | Vc | — | 0 |
| STEP2 | OFF | ON | P1 | Vc | DECIDED | DECIDED | UNDECIDED | Vc |
| | | | P2 | Vc | — | DECIDED | 0 | DECIDED |
| STEP3 | ON | OFF | P1 | Vb | DECIDED | — | Vc | — |
| | | | P2 | Vb' | — | — | — | — |

FIG. 4

| | 1ST FET | 2ND FET | DET NODE | DECISION → NORMAL | 1ST FET SHORT CIR | 2ND FET SHORT CIR | 1ST FET DISCON | 2ND FET DISCON |
|---|---|---|---|---|---|---|---|---|
| STEP1 | OFF | OFF | P1 | 0 | Vb | Vc | UNDECIDED | UNDECIDED |
| | | | P2 | Vc | Vb' | Vc | — | — |
| STEP2 | ON | OFF | P1 | Vb | DECIDED | DECIDED | 0 | UNDECIDED |
| | | | P2 | Vb' | DECIDED | DECIDED | Vc | 0 |
| STEP3 | OFF | ON | P1 | Vb' | — | — | DECIDED | — |
| | | | P2 | Vb' | — | — | — | Vc |

MOTOR CONTROL DEVICE AND ELECTRIC POWER STEERING EQUIPMENT HAVING THE SAME

CROSS REFERENCE TO RELATED APPLICATION

This application is based on Japanese Patent Application No. 2010-289219 filed on Dec. 27, 2010, the disclosure of which is incorporated herein by reference.

TECHNICAL FIELD

The present invention relates to a motor control device and electric power steering equipment having a motor control device.

BACKGROUND

Up to now, a motor control unit having a power relay, which interrupts or permits a power to be fed from a power supply to a motor, formed with semiconductor switching elements such as field-effect transistors (FETs) has been known. In the motor control unit described in the patent document 1 (i.e., JP-A-2010-74915), the power relay is formed by connecting two switching, elements in series with each other so that the polarities of parasitic diodes thereof are oriented mutually reversely. The motor control unit includes a drive circuit that is interposed between the power relay and motor and feeds a driving power to the motor, and two voltage sensors of a first voltage sensor and a second voltage sensor. The first voltage sensor detects a voltage on an output side of a first FET that is the switching element on the side of the power supply out of the two switching elements constituting the power relay. The second voltage sensor detects a voltage on an output side of a second FET that is the switching element on the drive circuit side of the first FET. In initial check to be performed before control of drive of the motor is begun, the first FET and second FET are controlled to be on or off. Based on voltages detected at this time by the first voltage sensor and second voltage sensor respectively, a short-circuit fault or disconnection fault in each of the first FET and second FET is detected.

In the motor control unit described in the patent document 1, the two voltage sensors are, as mentioned above, needed as physical components in order to detect the short-circuit fault or disconnection fault in each of the first FET and second FET. As processing components, a maximum of four steps has to be executed. Therefore, there is a fear that as a configuration may become more complex and the time required for detection of the fault may increase.

In addition, in the configuration of the motor control unit in the patent document 1, for detecting the short-circuit fault or disconnection fault of the second FET, it is necessary to preliminarily charge a capacitor interposed between the second FET and drive circuit. Therefore, unless a step (second step) of charging the capacitor by controlling the first FET to turn it on is completed, a step of detecting the short-circuit fault or disconnection fault of the second FET cannot be executed.

SUMMARY

In view of the above-described problem, it is an object of the present disclosure to provide a motor control device, which can quickly and reliably detect a fault that has occurred in a power relay. It is another object of the present disclosure to provide electric power steering equipment having a motor control device.

According to a first aspect of the present disclosure, a motor control device for detecting a short-circuit fault and a disconnection fault of a power relay, includes: a drive circuit supplying a driving electric power to a motor according to a supply voltage from a power supply; the power relay disposed on a power line, which couples the power supply and the drive circuit, wherein the power relay includes a first switching element disposed on the power line so that a polarity of a parasitic diode thereof is oriented toward the power supply, and a second switching element disposed on the power line on a drive circuit side of the first switching element so that a polarity of a parasitic diode thereof is oriented toward the drive circuit, and wherein the power relay interrupts and permits a current, which flows along the power line, according to operation of the first switching element and second switching element; a capacitor having one terminal connected to the power line between the second switching element and drive circuit; a voltage detector disposed on the power line between the first switching element and the second switching element, and detecting a voltage of the first switching element on a second switching element side; a charger charging the capacitor by applying a charge voltage to the capacitor; and a control section controlling the drive circuit to control drive of the motor, controlling operation of the power relay to interrupt and permit the current, which flows along the power line, and controlling operation of the charger to charge the capacitor. The control section executes a first step for detecting a short-circuit fault of one of the first switching element and second switching element according to the voltage detected by the voltage detector in a case where the control section controls both of the first switching element and second switching element to turn off after the control section controls the charger to charge the capacitor. When the control section does not detect the short-circuit fault of both of the first switching element and second switching element in the first step, the control section executes a second step for detecting a disconnection fault of the second switching element according to the voltage detected by the voltage detector in a case where the control section controls the first switching element to turn off, and controls the second switching element to turn on. When the control section does not detect the disconnection fault of the second switching element in the second step, the control section executes a third step for detecting a disconnection fault of the first switching element according to the voltage detected by the voltage detector in a case where the control section controls the first switching element to turn on, and controls the second switching element to turn off.

In the motor control device, a short-circuit fault and disconnection fault in each of the first switching element and second switching element can be detected by executing three steps at a maximum. In addition, at each of the steps, the short-circuit fault or disconnection fault of each of the switching elements can be detected by deciding whether the voltage detected by the voltage detector is 0 or other than 0. As a physical component, the charger is needed. However, only one voltage detector is needed in order to detect the short-circuit fault or disconnection fault of the power relay. Therefore, the motor control device can quickly and reliably detect the fault, which has occurred in the power relay, despite the relatively simple configuration.

According to a second aspect of the present disclosure, electric power steering equipment includes: the motor control device according to the first aspect; and the motor outputting an assist torque for a steering wheel. The motor control device in accordance with the first aspect can quickly and reliably detect a fault that has occurred in the power relay. Therefore, the motor control device is preferably adapted especially to the electric power steering equipment in which control of drive of the motor has to be ceased if the fault has occurred in the power relay of the motor control unit.

According to a third aspect of the present disclosure, a motor control device for detecting a short-circuit fault and a disconnection fault of a power relay, includes: a drive circuit supplying a driving electric power to a motor according to a supply voltage from a power supply; the power relay disposed on a power line, which couples the power supply and the drive circuit, wherein the power relay includes a first switching element disposed on the power line so that a polarity of a parasitic diode thereof is oriented toward the power supply, and a second switching element disposed on the power line on a drive circuit side of the first switching element so that a polarity of a parasitic diode thereof is oriented toward the drive circuit, and wherein the power relay interrupts and permits a current, which flows along the power line, according to operation of the first switching element and second switching element; a capacitor having one terminal connected to the power line between the second switching element and drive circuit; a voltage detector disposed on the power line between the first switching element and the second switching element, and detecting a voltage of the first switching element on a second switching element side; a charger charging the capacitor by applying a charge voltage to the capacitor; and a control section controlling the drive circuit to control drive of the motor, controlling operation of the power relay to interrupt and permit the current, which flows along the power line, and controlling operation of the charger to charge the capacitor. The control section executes a first step for detecting a short-circuit fault of one of the first switching element and second switching element according to the voltage detected by the voltage detector in a case where the control section controls both of the first switching element and second switching element to turn off after the control section controls the charger to charge the capacitor. When the control section does not detect the short-circuit fault of both of the first switching element and second switching element in the first step, the control section executes a second step for detecting a disconnection fault of the first switching element according to the voltage detected by the voltage detector in a case where the control section controls the first switching element to turn on, and controls the second switching element to turn off. When the control section does not detect the disconnection fault of the first switching element in the second step, the control section executes a third step for detecting a disconnection fault of the second switching element according to the voltage detected by the voltage detector in a case where the control section controls the first switching element to turn off, and controls the second switching element to turn on.

In the above motor control device, a short-circuit fault and disconnection fault in each of the first switching element and second switching element can be detected by executing three steps at a maximum. In addition, at each of the steps, the short-circuit fault or disconnection fault of each of the switching elements can be detected by deciding whether a voltage detected by the voltage detector is 0 or other than 0. As a physical component, the charger is needed. However, the number of voltage detectors needed to detect the short-circuit fault or disconnection fault of the power relay is one. Therefore, the fault having occurred in the power relay can be quickly and reliably detected despite a relatively simple configuration.

According to a fourth aspect of the present disclosure, electric power steering equipment includes: the motor control device according to the third aspect; and the motor outputting an assist torque for a steering wheel. The motor control device in accordance with the third aspect can quickly and reliably detect a fault that has occurred in the power relay. Therefore, the motor control device is preferably adapted especially to the electric power steering equipment in which control of drive of the motor has to be ceased if the fault has occurred in the power relay of the motor control unit.

BRIEF DESCRIPTION OF THE DRAWINGS

The above and other objects, features and advantages of the present invention will become more apparent from the following detailed description made with reference to the accompanying drawings. In the drawings:

FIG. 3 is a diagram for use in explaining fault detection processing to be performed by the motor control device in accordance with the first embodiment; and FIG. 4 is a diagram for use in explaining fault detection processing to be performed by a motor control unit in accordance with a second embodiment.

DETAILED DESCRIPTION

Figure 1:
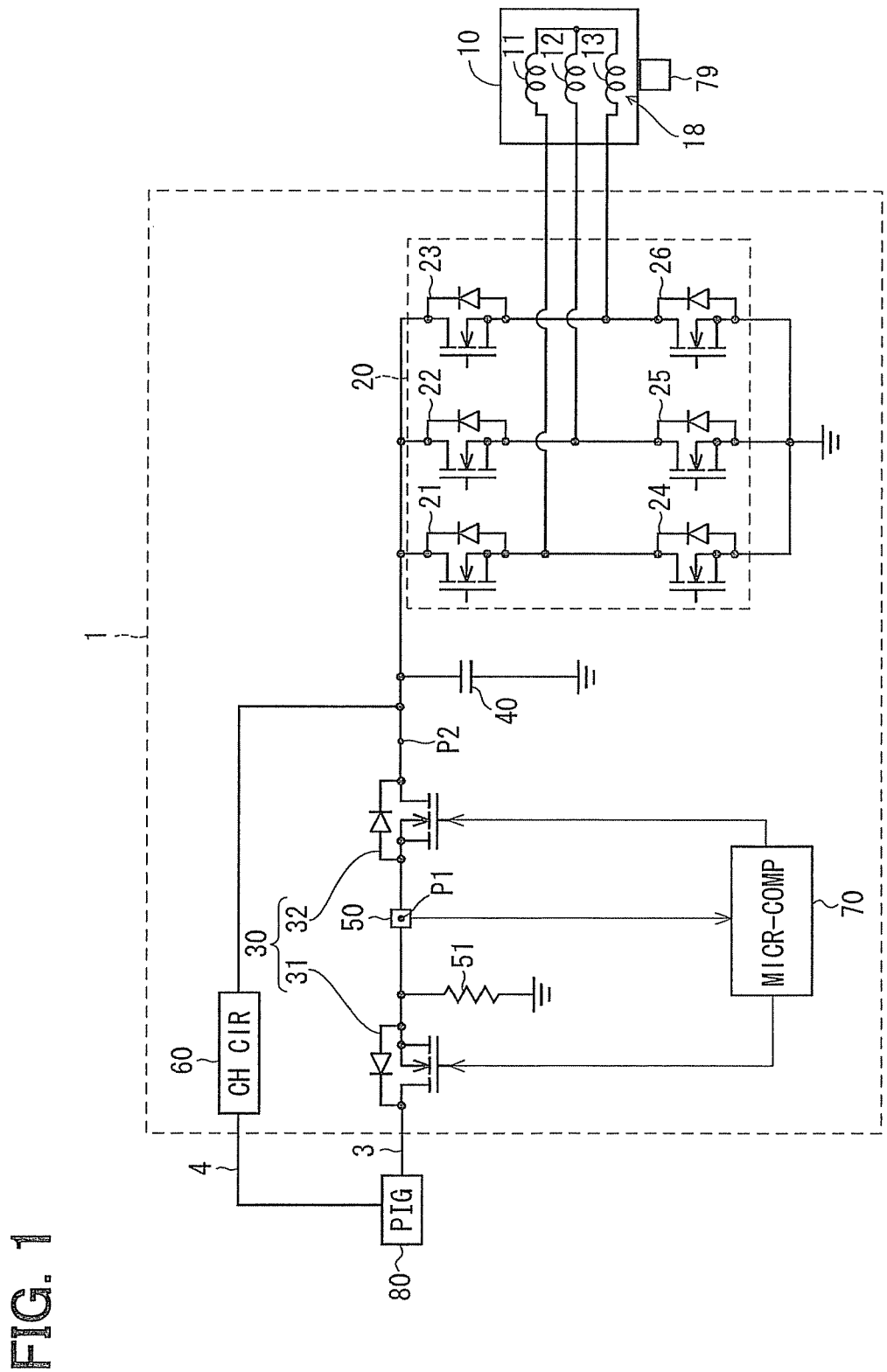
FIG. 1 is a schematic diagram showing a motor control device in accordance with a first embodiment.

Referring to the drawings, a motor control unit in accordance with the present invention will be described below.

First Embodiment

FIG. 1 shows a motor control unit in accordance with a first embodiment of the present invention. The motor control unit 1 controls drive of a motor 10. The motor control unit 1 is adapted to electric power steering equipment that assists in a manipulation of steering, for example, a vehicle.

Figure 2:
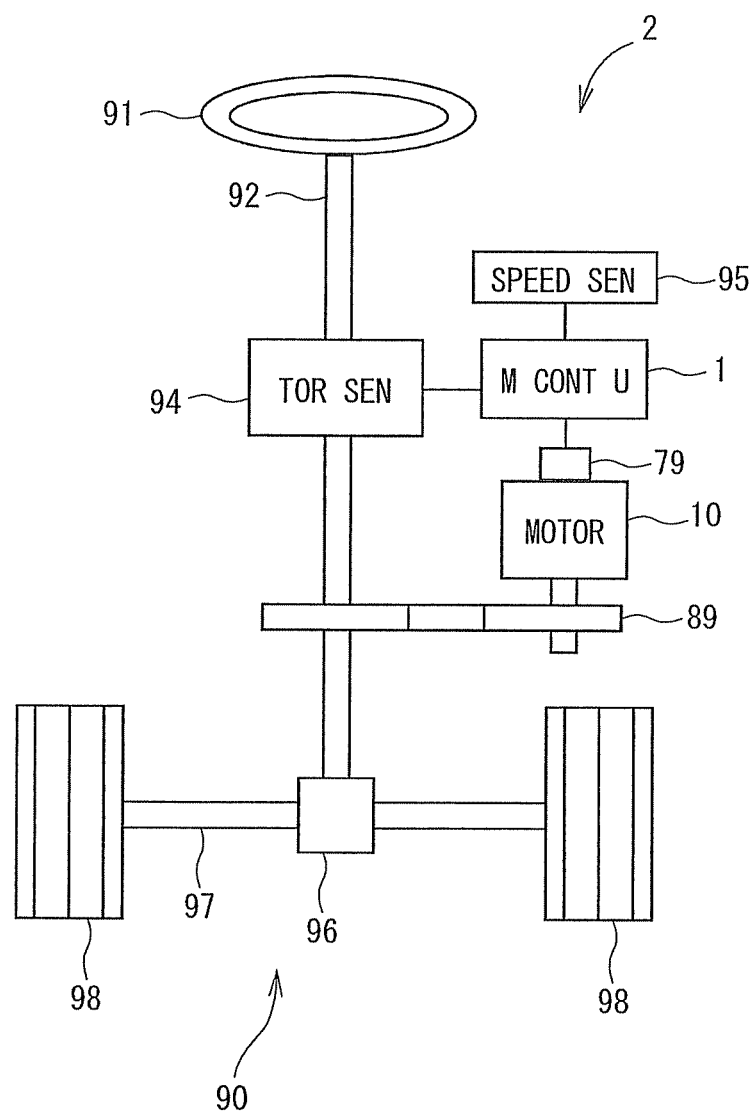
FIG. 2 is an illustrative diagram showing electric power steering equipment to which the motor control device in accordance with the first embodiment is adapted, and a steering system.

FIG. 2 is a diagram showing an overall configuration of a steering system 90 including electric power steering equipment 2 for which the motor control unit 1 is adopted. A pinion gear 96 is attached to the tip of a steering shaft 92. The pinion gear 96 is engaged with a rack shaft 97. A pair of wheels 98 is joined to the ends of the rack shaft 97 via tie-rods or the like. Thus, when a driver turns a steering wheel 91, the steering shaft 92 coupled to the steering wheel 91 rotates. A rotational motion of the steering shaft 92 is converted into a linear motion of the rack shaft 97 by the pinion gear 96, whereby the pair of wheels 98 is steered to be at an angle proportional to a displacement of the rack shaft 97 due to the linear motion thereof.

The electric power steering equipment 2 includes a motor 10 that outputs an assist torque for steering, a speed reducing gear train 89 that decelerates the rotation of the motor 10 and conveys energy to the steering shaft 92, and the motor control unit 1.

Herein, the motor 10 is a three-phase brushless motor and includes a rotor and a stator that are not shown. The rotor is a disk-like member, has a permanent magnet bonded to the surface thereof, and has magnetic poles. The stator internally accommodates the rotor and supports the rotor so that the rotor can be rotated. The stator has salient parts that jut in radially inward directions at intervals of a predetermined angle. A U coil 11, a V coil 12, and a W coil 13 that are shown in FIG. 1 are wound about the salient parts. The U coil 11, V coil 12, and W coil 13 are windings associated with a U phase, a V phase, and a W phase respectively, and constitute a winding assembly 18. On the motor 10, a positional sensor 79 that detects a rotational position is disposed.

On the steering shaft 92 coupled to the steering wheel 91, a torque sensor 94 that detects a steering torque is disposed.

To the motor control unit 1, the positional sensor 79, the torque sensor 94, and a vehicle speed sensor 95 that detects a vehicle speed are connected. The motor control unit 1 controls the rotation of the motor 10 on the basis of the rotational position of the motor 10 detected by the positional sensor 79, the steering torque detected by the torque sensor 94, and the vehicle speed detected by the vehicle speed sensor 95. The motor 10 forwardly and reversely rotates the speed reducing gear train 89. Owing to the configuration, the electric power steering equipment 2 uses the motor 10 to generate an assist torque, with which steering of the steering wheel 91 is assisted, and transmits the torque to the steering shaft 92. The electric power steering equipment 2 is so-called column type electric power steering equipment.

Next, the configuration of the motor control unit 1 will be described below. As shown in FIG. 1, the motor control unit 1 includes an inverter 20 serving as a drive circuit, a power relay 30, a capacitor 40, a voltage sensor 50 serving as a voltage detector, a charge circuit 60 serving as a charger, and a microcomputer 70 serving as a control section.

The inverter 20 is a three-phase inverter, and has six switching elements 21 to 26 bridge-connected for the purpose of switching conductions to the U coil 11, V coil 12, and W coil 13 respectively included in the winding assembly 18. The switching elements 21 to 26 are, in the present embodiment, metal-oxide semiconductor field-effect transistors (MOSFETs) that belong to one type of field-effect transistors. Hereinafter, the switching elements 21 to 26 shall be called FETs 21 to 26.

The three FETs 21 to 23 have the drains thereof connected onto a power line 3 that is coupled to a positive electrode of a battery 80 serving as a power supply. The sources of the FETs 21 to 23 are connected to the drains of the FETs 24 to 26. The sources of the FETs 24 to 26 are grounded. As shown in FIG. 1, a node between the paired FETs 21 and 24 is connected to one end of the U coil 11. A node between the paired FETs 22 and 25 is connected to one end of the V coil 12. Further, a node between the paired FETs 23 and 26 is connected to one end of the W coil 13.

As mentioned above, in the present embodiment, the motor control unit 1 includes an inverter of one system (inverter 20). The inverter 20 has activation thereof controlled by the microcomputer 70 to be described later, and converts a power, which is fed from the battery 80 to the motor 10, to a form that allows the motor to rotate. In the present embodiment, the voltage of the battery 80, that is, a supply voltage Vb is set to approximately 12 V.

The power relay 30 is disposed on the power line 3 that links the battery 80 with the inverter 20. The power relay 30 includes a first FET 31 serving as a first switching element and a second FET 32 serving as a second switching element. The first FET 31 and second FET 32 are, similarly to the FETs 21 to 26, MOSFETs.

The first FET 31 is disposed on the power line 3 so that the polarity (forward direction) of a parasitic diode thereof is oriented toward the battery 80. Therefore, when the first FET 31 is off, no current flows from the battery 80 into the inverter 20. The second FET 32 is disposed on the inverter 20 side of the first FET 31 so that the polarity (forward direction) of a parasitic diode thereof is oriented toward the inverter 20. Therefore, when the second FET 32 is off, no current flows from the inverter 20 into the battery 80. Namely, the first FET 31 and second FET 32 are connected in series with each other so that the polarities of the parasitic diodes thereof are oriented mutually reversely.

The power relay 30 is controlled to be on or off by the microcomputer 70 to be described later, and thus interrupts or permits flow of a current among the battery 80, inverter 20, and motor 10. In the present embodiment, the power relay 30 is a so-called normally open type power relay. When an On command sent from the microcomputer 70 is not found, the first FET 31 and second FET 32 are left open (off). Therefore, the power relay 30 interrupts the flow of the current. When the On command sent from the microcomputer 70 is found, the first FET 31 and second FET 32 are closed (on). Therefore, the power relay 30 permits the flow of the current.

One of the terminals of the capacitor 40 is connected onto the power line 3 between the second FET 32 (power relay 30) and inverter 20 (FET 21), and the other terminal thereof is grounded. The capacitor 40 preserves charge. Thus, when the motor 10 is driven, the capacitor 40 assists in feeding a power to the FETs 21 to 26, or suppresses a ripple current that is generated when the power is fed from the battery 80 to the motor 10.

The voltage sensor 50 is disposed on the power line 3 between the first FET 31 and second FET 32, and detects a voltage on the second FET 32 side of the first FET 31. More particularly, the voltage sensor 50 detects a voltage at a node P1 (see FIG. 1) on the power line 3 between the first FET 31 and second FET 32. In the present embodiment, a pull-down resistor 51 is connected onto the power line 3 between the first FET 31 and voltage sensor 50.

The charge circuit 60 is disposed on a lead wire 4 that links the battery 80 with a node on the power line 3 between the second FET 32 and inverter 20. The activation of the charge circuit 60 is controlled by the microcomputer 70 to be described later, and can feed a power of the battery 80 to the node between the second FET 32 and inverter 20. Thus, the charge circuit 60 can charge the capacitor 40 by applying a voltage to the capacitor 40. In the present embodiment, a supply voltage Vb of the battery 80 is approximately 12 V. The charge circuit 60 steps down the voltage of the battery 80 to approximately 5 V, and applies it to the capacitor 40. Therefore, when the charge circuit 60 charges the capacitor 40, the voltage across the capacitor 40, that is, a charge voltage Vc becomes approximately 5 V.

The microcomputer 70 is a compact computer including integrated circuits or the like, and is connected to various components of the motor control unit 1 and detectors. Programs are stored in a memory of the microcomputer 70. According to the programs, the microcomputer 70 executes various pieces of processing and controls activation of a component that is a connection destination.

The microcomputer 70 is connected to the power relay 30 (first FET 31 and second FET 32) and to each of the FETs 21 to 26. In FIG. 1, for brevity's sake, connection lines linking the microcomputer 70 with the FETs 21 to 26 are not shown. In addition, an ignition power supply that is not shown is connected to the microcomputer 70. When a driver of a vehicle turns on an ignition switch, a power is fed from the ignition power supply to the microcomputer 70. Various pieces of processing to be performed by the microcomputer 70 are initiated accordingly.

In the present embodiment, when the microcomputer 70 does not send an On command to the power relay 30, the power relay 30 is left open (remains off). Therefore, flow of a current from the battery 80 through the inverter 20 to the motor 10 is interrupted. In contrast, when the microcomputer 70 sends the On command to the power relay 30, the power relay 30 is controlled to be closed (be on). Thus, the flow of the current is permitted. The microcomputer 70 thus controls activation of the power relay 30 so as to interrupt or permit the flow of the current.

In addition, when the flow of a current is permitted by the power relay 30, the microcomputer 70 switches the on and off states of the FETs 21 to 26 so as to convert a direct current fed from the battery 80 into a sine-wave current whose phase varies depending on the phase of the coil, and causes the sine-wave current to flow into each of the coils of the different phases (U coil 11, V coil 12, or W coil 13). Accordingly, the motor 10 rotates. The microcomputer 70 adjusts the torque of the motor 10 and the number of rotations thereof through pulse-width modulation (PWM) control. Thus, the microcomputer 70 controls the rotation of the motor 10 by switching the on and off states of the FETs 21 to 26.

In addition, the microcomputer 70 is connected to the charge circuit 60. By controlling activation of the charge circuit 60, the microcomputer 70 can charge the capacitor 40 for an arbitrary period of time at arbitrary timing.

Further, the microcomputer 70 is connected to the voltage sensor 50. Accordingly, a signal concerning a voltage to be detected by the voltage sensor 50 is inputted to the microcomputer 70. Therefore, the microcomputer 70 can detect a voltage at the node P1 on the power line 3 between the first FET 31 and second FET 32 (see FIG. 1).

Next, fault detection processing for the power relay 30 to be performed by the microcomputer 70 of the motor control unit 1 in accordance with the present embodiment will be described in conjunction with FIG. 1 and FIG. 3.

When a driver turns on the ignition switch, a power is fed from the ignition power supply, and the microcomputer 70 initiates fault detection processing for the power relay 30. Namely, the fault detection processing for the power relay 30 is included in initial check to be performed before control of drive of the motor 10 is begun.

After initiating the fault detection processing for the power relay 30, the microcomputer 70 controls activation of the charge circuit 60 to charge the capacitor 40. Accordingly, a voltage Vc across the capacitor 40 becomes approximately 5 V.

(Step 1)

After charging the capacitor 40, the microcomputer 70 executes step 1 that is the first step. At step 1, the microcomputer 70 controls the first FET 31 and second FET 32 to turn them off. Based on a voltage detected at this time by the voltage sensor 50, the microcomputer 70 decides whether a short-circuit fault has occurred in at least one of the first FET 31 and second FET 32.

If both the first FET 31 and second FET 32 are controlled to be off, as long as the short-circuit fault has not occurred in the first FET 31 or second FET 32, a current does not flow from the battery 80 into the pull-down resistor 51 via the first FET 31. In addition, charge accumulated in the capacitor 40 does not flow into the pull-down resistor 51 via the second FET 32. Therefore, unless the short-circuit fault has occurred in either of the first FET 31 and second FET 32, a voltage at the node P1 (between the first FET 31 and second FET 32) to be detected by the voltage sensor 50 at step 1 should be 0.

Therefore, as specified in FIG. 3 in association with step 1, when the voltage at the node P1 detected by the voltage sensor 50 is 0, the microcomputer 70 decides that the short-circuit fault has not occurred in either of the first FET 31 and second FET 32 which constitute the power relay 30 (normal), that is, the short-circuit fault has not occurred in the power relay 30.

In contrast, if the voltage at the node P1 detected by the voltage sensor 50 is not 0 but is equal to the supply voltage Vb (approximately 12 V), the microcomputer 70 decides that the short-circuit fault has occurred in the first FET 31. If the voltage at the node P1 detected by the voltage sensor 50 is not 0 but is equal to the charge voltage Vc (approximately 5 V), the microcomputer 70 decides that the short-circuit fault has occurred in the second FET 32. Thus, by executing step 1, the microcomputer 70 can detect the short-circuit fault in the power relay 30. In addition, based on the voltage value detected by the voltage sensor 50, the microcomputer 70 can decide in which of the first FET 31 and second FET 32 the short-circuit fault has occurred. If the microcomputer 70 detects the short-circuit fault of the power relay 30 at step 1, the microcomputer 70 exits the fault detection processing, and suspends subsequent control of drive of the motor 10 to be performed by the motor control unit 1.

(Step 2)

If the short-circuit fault is not detected in either of the first FET 31 and second FET 32 through execution of step 1, the microcomputer 70 executes step 2 that is the second step. At step 2, the microcomputer 70 controls the first FET 31 to turn it on, and controls the second FET 32 to turn it on. Based on a voltage detected at this time by the voltage sensor 50, the microcomputer 70 decides whether a disconnection fault has occurred in the second FET 32.

If the second FET 32 is controlled to be on, as long as the disconnection fault has not occurred in the second FET 32, the second FET 32 remains on. Charge accumulated in the capacitor 40 flows into the pull-down resistor 51 via the second FET 32. Therefore, unless the disconnection fault has occurred in the second FET 32, a voltage at the node P1 to be detected by the voltage sensor 50 at step 2 should be equal to the charge voltage Vc (approximately 5 V).

Therefore, as specified in FIG. 3 in association with step 2, if the voltage at the node P1 detected by the voltage sensor 50 is equal to the charge voltage Vc, the microcomputer 70 decides that the disconnection fault has not occurred in the second FET 32 (normal). In contrast, if the voltage at the node P1 detected by the voltage sensor 50 is not equal to the charge voltage Vc but 0, the microcomputer 70 decides that the disconnection fault has occurred in the second FET 32. If the microcomputer 70 detects the disconnection fault of the power relay 30 (second FET 32) at step 2, the microcomputer 70 exits the fault detection processing, and suspends subsequent control of drive of the motor 10 to be performed by the motor control unit 1.

(Step 3)

If the disconnection fault of the second FET 32 is not detected through execution of step 2, the microcomputer 70 executes step 3 that is the third step. At step 3, the microcomputer 70 controls the first FET 31 to turn it on, and controls the second FET 32 to turn it off. Based on a voltage detected at this time by the voltage sensor 50, the microcomputer 70 decides whether the disconnection fault has occurred in the first FET 31.

When the first FET 31 is controlled to be on, as long as the disconnection fault has not occurred in the first FET 31, the first FET 31 remains on, and a current flows from the battery 80 into the pull-down resistor 51 via the first FET 31. Therefore, unless the disconnection fault has occurred in the first FET 31, the voltage at the node P1 to be detected by the voltage sensor 50 at step 3 should be equal to the supply voltage Vb (approximately 12 V).

Therefore, as specified in FIG. 3 in association with step 3, if the voltage at the node P1 detected by the voltage sensor 50 is equal to the supply voltage Vb, the microcomputer 70 decides that the disconnection fault has not occurred in the first FET 31 (normal). In contrast, if the voltage at the node P1 detected by the voltage sensor 50 is not equal to the supply voltage Vb but 0, the microcomputer 70 decides that the disconnection fault has occurred in the first FET 31. If the microcomputer 70 detects the disconnection fault of the power relay 30 (first FET 31) at step 3, the microcomputer 70 exits fault detection processing, and suspends subsequent control of drive of the motor 10 to be performed by the motor control unit 1.

As mentioned above, the microcomputer 70 can detect the disconnection fault of the power relay 30 by executing step 2 and step 3 subsequently to step 1.

Fault detection processing for the power relay 30 to be performed by the microcomputer 70 has been described so far. If the short-circuit fault or disconnection fault of the power relay 30 is not detected through the fault detection processing (steps 1 to 3), the microcomputer 70 decides that the power relay 30 is normal. Thereafter, the microcomputer 70 initiates control of drive of the motor 10 to be performed by the motor control unit 1. Eventually, the electric power steering equipment 2 begins assisting in steering.

In the present embodiment, if the microcomputer 70 detects the short-circuit fault of the first FET 31 or second FET 32 at step 1, detects the disconnection fault of the second FET 32 at step 2, or detects the disconnection fault of the first FET 31 at step 3, the microcomputer 70 stores information concerning the fault of the first FET 31 or second FET 32 as diagnostic information, and notifies a driver of the fact that the fault has occurred in the power relay 30 of the electric power steering equipment 2.

In FIG. 3, for reference, a voltage at a node P2 (see FIG. 1) on the power line 3 between the second FET 32 and capacitor 40 is specified in relation to each of the steps.

At step 1, if a short-circuit fault has not occurred in either of the first FET 31 and second FED 32 (normal), or if the short-circuit fault has occurred in the second FET 32 alone, the voltage at the node P2 should be equal to the charge voltage Vc (approximately 5 V). In contrast, if the short-circuit fault has occurred in the first FET 31 alone, a current flows from the battery 80 into the node P2 via the parasitic diodes of the first FET 31 and second FET 32. At this time, the voltage at the node P2 should be equal to a voltage Vb' that is slightly lower than the supply voltage Vb.

At step 2, even if a disconnection fault has not occurred in the second FET 32 (normal) or has occurred in the second FET 32, the voltage at the node P2 should be equal to the charge voltage Vc.

At step 3, if the disconnection fault has not occurred in the first FET 31 (normal), a current flows from the battery 80 into the node P2 via the parasitic diodes of the first FET 31 and second FET 32 respectively. Therefore, at this time, the voltage at the node P2 should be equal to the voltage Vb' that is slightly lower than the supply voltage Vb. In contrast, if the disconnection fault has occurred in the first FET 31, the voltage at the node P2 should be equal to the charge voltage Vc (approximately 5 V).

As mentioned above, the voltage at the node P2 varies depending on the faulty states of the first FET 31 and second FET 31 at each of the steps. However, in the present embodiment, merely by detecting the voltage at the node P1, a decision can be made on the faulty states of the first FET 31 and second FET 32 (see FIG. 3). Therefore, since the voltage at the node P1 alone should be detected, only one voltage sensor (voltage sensor 50) is needed.

As described above, in the present embodiment, after the microcomputer 70 charges the capacitor 40 by controlling activation of the charge circuit 60, the microcomputer 70 executes step 1 of controlling the first FET 31 and second FET 32 to turn them off, and detecting a short-circuit fault in at least one of the first FET 31 and second FET 32 on the basis of a voltage detected at this time by the voltage sensor 50.

For example, if the voltage detected by the voltage sensor 50 at step 1 is 0, the microcomputer 70 decides that the short-circuit fault has not occurred in either of the first FET 31 and second FET 32 constituting the power relay 30, that is, that the short-circuit fault has not occurred in the power relay 30. In contrast, if the voltage detected by the voltage sensor 50 at step 1 is not 0, the microcomputer 70 decides that the short-circuit fault has occurred in at least one of the first FET 31 and second FET 32 constituting the power relay 30, that is, that the short-circuit fault has occurred in the power relay 30. Thus, the microcomputer 70 can detect the short-circuit fault of the power relay 30 by executing step 1.

In addition, if the short-circuit fault is not detected in either of the first FET 31 and second FET 32 through execution of step 1, the microcomputer 70 executes step 2 of controlling the first FET 31 to turn it off, controlling the second FET 32 to turn it on, and detecting a disconnection fault of the second FET 32 on the basis of a voltage detected at this time by the voltage sensor 50.

For example, if the voltage detected by the voltage sensor 50 at step 2 is not 0, the microcomputer 70 decides that the disconnection fault has not occurred in the second FET 32. In contrast, if the voltage detected by the voltage sensor 50 at step 2 is 0, the microcomputer 70 decides that the disconnection fault has occurred in the second FET 32.

Further, if the disconnection fault of the second FET 32 is not detected through execution of step 2, the microcomputer 70 executes step 3 of controlling the first FET 31 to turn it on, controlling the second FET 32 to turn it off, and detecting the disconnection fault of the first FET 31 on the basis of a voltage detected at this time by the voltage sensor 50.

For example, if the voltage detected by the voltage sensor 50 at step 3 is not 0, the microcomputer 70 decides that the disconnection fault has not occurred in the first FET 31. In contrast, if the voltage detected by the voltage sensor 50 at step 3 is 0, the microcomputer 70 decides that the disconnection fault has occurred in the first FET 31. Thus, the microcomputer 70 can detect the disconnection fault of the power relay 30 by executing step 2 and step 3 subsequently to step 1.

As mentioned above, in the present embodiment, by executing three steps at a maximum, the short-circuit fault or disconnection fault of each of the first FET 31 and second FET 32 can be detected. At each of the steps, by deciding whether a voltage detected by the voltage sensor 50 is 0 or other than 0, the short-circuit fault or disconnection fault of each of the switching elements (first FET 31 and second FET 32) can be detected. As a physical component, the charge circuit 60 is needed. However, the number of voltage sensors 50 needed to detect the short-circuit fault or disconnection fault of the power relay 30 (first FET 31 and second FET 32) is one. Thus, the present embodiment can quickly and reliably detect the fault, which has occurred in the power relay 30, despite a relatively simple configuration.

In addition, in the present embodiment, the charge circuit 60 can charge the capacitor 40 by applying a voltage (Vc: approximately 5 V), which is different from the supply voltage of the battery 80 (Vb: approximately 12 V), to the capacitor 40. Thus, based on the voltage detected by the voltage sensor 50 at step 1, the microcomputer 70 can decide in which of the first FET 31 and second FET 32 the short-circuit fault has occurred.

For example, if the voltage detected by the voltage sensor 50 at step 1 is a voltage (approximately 12 V) equivalent to the supply voltage Vb, a decision can be made that the short-circuit fault has occurred in the first FET 31. In contrast, if the voltage detected by the voltage sensor 50 at step 1 is a voltage (approximately 5 V) equivalent to the charge voltage Vc of the capacitor 40, a decision can be made that the short-circuit fault has occurred in the second FET 32.

A case where the motor control unit 1 in accordance with the present embodiment is adapted to the electric power steering equipment 2 has been described so far. The motor control unit 1 can quickly and reliably detect a fault that has occurred in the power relay 30. Therefore, the present embodiment is preferably applied to the electric power steering equipment 2 in which in case the fault occurs in the power relay 30 of the motor control unit 1, control of drive of the motor 10 has to be suspended.

Second Embodiment

A motor control unit in accordance with a second embodiment of the present invention has a physical configuration identical to that of the motor control unit of the first embodiment. However, an approach of the microcomputer 70 to fault detection processing for the power relay 30 is different from that in the first embodiment.

Fault detection processing for the power relay 30 to be performed by the microcomputer 70 in the second embodiment will be described below in conjunction with FIG. 1 and FIG. 4.

Similarly to the first embodiment, when a driver turns on an ignition switch, a power is fed from an ignition power supply. Accordingly, the microcomputer 70 initiates the fault detection processing for the power relay 30.

After initiating the fault detection processing for the power relay 30, the microcomputer 70 first charges the capacitor 40 by controlling activation of the charge circuit 60. Accordingly, a voltage Vc across the capacitor 40 becomes approximately 5 V.

(Step 1)

After charging the capacitor 40, the microcomputer 70 executes step 1 that is the first step. At step 1, the microcomputer 70 controls the first FET 31 and second FET 32 to turn them off. Based on a voltage detected at this time by the voltage sensor 50, the microcomputer 70 decides whether a short-circuit fault has occurred in at least one of the first FET 31 and second FET 32.

If both the first FET 31 and second FET 32 are controlled to be off, as long as the short-circuit fault has not occurred in the first FET 31 or second FET 32, a current does not flow from the battery 80 into the pull-down resistor 51 via the first FET 31. In addition, charge accumulated in the capacitor 40 does not flow into the pull-down resistor 51 via the second FET 32. Therefore, unless the short-circuit fault has occurred in either of the first FET 31 and second FET 32, a voltage at the node P1 to be detected by the voltage sensor 50 at step 1 (between the first FET 31 and second FET 2) should be 0.

As specified in FIG. 4 in association with step 1, if the voltage at the node P1 detected by the voltage sensor 50 is 0, the microcomputer 70 decides that the short-circuit fault has not occurred in either of the first FET 31 and second FET 32 constituting the power relay 30 (normal), that is, that the short-circuit fault has not occurred in the power relay 30.

In contrast, if the voltage at the node P1 detected by the voltage sensor 50 is not 0 but is equal to a supply voltage (approximately 12 V), the microcomputer 70 decides that the short-circuit fault has occurred in the first FET 31. If the voltage at the node P1 detected by the voltage sensor 50 is not 0 but is equal to a charge voltage Vc (approximately 5V), the microcomputer 70 decides that the short-circuit fault has occurred in the second FET 32. Thus, the microcomputer 70 can detect the short-circuit fault of the power relay 30 by executing step 1. Based on the voltage value detected by the voltage sensor 50, the microcomputer 70 can decide in which of the first FET 31 and second FET 32 the short-circuit fault has occurred. If the microcomputer 70 detects the short-circuit fault of the power relay 31 at step 1, the microcomputer 70 exits the fault detection processing, and suspends subsequent control of drive of the motor 10 to be performed by the motor control unit 1.

(Step 2)

If the short-circuit fault is not detected in either of the first FET 31 and second FET 32 through execution of step 1, the microcomputer 70 executes step 2 that is the second step. At step 2, the microcomputer 70 controls the first FET 31 to turn it on, and controls the second FET 32 to turn it off. Based on a voltage detected at this time by the voltage sensor 50, the microcomputer 70 decides whether a disconnection fault has occurred in the first FET 31.

When the first FET 31 is controlled to be on, as long as the disconnection fault has not occurred in the first FET 31, the first FET 31 remains on. A current flows from the battery 80 into the pull-down resistor 51 via the first FET 31. Therefore, unless the disconnection fault has occurred in the first FET 31, the voltage at the node P1 to be detected by the voltage sensor 50 at step 3 should be equal to the supply voltage Vb (approximately 12 V).

As specified in FIG. 4 in association with step 2, if the voltage at the node P1 detected by the voltage sensor 50 is equal to the supply voltage Vb, the microcomputer 70 decides that the disconnection fault has not occurred in the first FET 31 (normal). In contrast, if the voltage at the node P1 detected by the voltage sensor 50 is not equal to the supply voltage Vb but 0, the microcomputer 70 decides that the disconnection fault has occurred in the first FET 31. If the microcomputer 70 detects the disconnection fault of the power relay 30 (first FET 31), the microcomputer 70 exits the fault detection processing and suspends subsequent control of drive of the motor 10 to be performed by the motor control unit 1.

When the first FET 31 is controlled to be on at step 2, even if the second FET 32 is controlled to be off, a current flows from the battery 80 via the parasitic diodes of the first FET 31 and second FET 32. The capacitor 40 is therefore charged. Eventually, at step 2 and thereafter, the voltage across the capacitor 40 becomes a voltage Vb' that is slightly lower than the supply voltage Vb.

(Step 3)

If the disconnection fault of the first FET 31 is not detected through execution of step 2, the microcomputer 70 executes step 3 that is the third step. At step 3, the microcomputer 70 controls the first FET 31 to turn it off, and controls the second FET 32 to turn it on. Based on a voltage detected at this time by the voltage sensor 50, the microcomputer 70 decides whether a disconnection fault has occurred in the second FET 32.

If the second FET 32 is controlled to be on, as long as the disconnection fault has not occurred in the second FET 32, the second FET 32 remains on. Charge accumulated in the capacitor 40 flows into the pull-down resistor 51 via the second FET 32. As mentioned above, in the present embodiment, at step 2 and thereafter, the voltage across the capacitor 40 is equal to the voltage Vb'. Therefore, unless the disconnection fault has occurred in the second FET 32, the voltage at the node P1 to be detected by the voltage sensor 50 at step 2 should be equal to the voltage Vb'.

As specified in FIG. 4 in association with step 3, if the voltage at the node P1 detected by the voltage sensor 50 is equal to the voltage Vb', the microcomputer 70 decides that the disconnection fault has not occurred in the second FET 32 (normal). In contrast, if the voltage at the node P1 detected by the voltage sensor 50 is not equal to the voltage Vb' but is 0, the microcomputer 70 decides that the disconnection fault has occurred in the second FET 32. If the microcomputer 70 detects the disconnection fault of the power relay 30 (second FET 32) at step 3, the microcomputer 70 exits the fault detection processing, and suspends subsequent control of drive of the motor 10 to be performed by the motor control unit 1.

As mentioned above, by executing step 2 and step 3 subsequently to step 1, the microcomputer 70 can detect the disconnection fault of the power relay 30.

The fault detection processing for the power relay 30 to be performed by the microcomputer 70 in the second embodiment has been described so far. If the short-circuit fault or disconnection fault of the power relay 30 is not detected through the fault detection processing (steps 1 to 3), the microcomputer 70 decides that the power relay 30 is normal. Thereafter, the microcomputer 70 initiates control of drive of the motor 10 to be performed by the motor control unit 1. Eventually, the electric power steering equipment 2 begins assisting in steering.

In the present embodiment, if the microcomputer 70 detects the short-circuit fault of the first FET 31 or second FET 32 at step 1, detects the disconnection fault of the first FET 31 at step 2, or detects the disconnection fault of the second FET 32 at step 3, the microcomputer 70 stores information concerning the fault of the first FET 31 or second FET 32 as diagnostic information, and notifies a driver of the fact that the power relay 30 of the electric power steering equipment 2 has failed.

In FIG. 4, for reference, a voltage at the node P2 (see FIG. 1) on the power line 3 between the second FET 32 and capacitor 40 is specified in relation to each of the steps.

At step 1, if a short-circuit fault has not occurred in either of the first FET 31 and second FET 32 (normal), or if the short-circuit fault has occurred in the second FET 32 alone, the voltage at the node P2 should be equal to the charge voltage Vc (approximately 5 V). In contrast, if the short-circuit fault has occurred in the first FET 31 alone, a current flows from the battery 80 into the node P2 via the parasitic diodes of the first FET 31 and second FET 32 respectively. Therefore, at this time, the voltage at the node P2 should be equal to the voltage Vb' that is slightly lower than the supply voltage Vb.

At step 2, if a disconnection fault has not occurred in the first FET 31 (normal), a current flows from the battery 80 into the node P2 via the parasitic diodes of the first FET 31 and second FET 32 respectively. Therefore, at this time, the voltage at the node P2 should be equal to the voltage Vb' that is slightly lower than the supply voltage Vb. In contrast, if the disconnection fault has occurred in the first FET 31, the voltage at the node P2 should be equal to the charge voltage Vc (approximately 5 V).

At step 3, if the disconnection fault has not occurred in the second FET 32 (normal), the voltage across the capacitor is equal to the voltage Vb' at step 2 and thereafter. Therefore, the voltage at the node P2 should be equal to the voltage Vb'. In contrast, if the disconnection fault has occurred in the second FET 32, the voltage at the node P2 should be equal to the charge voltage Vc (approximately 5 V).

As mentioned above, the voltage at the node P2 varies depending on the faulty states of the first FET 31 and second FET 32 at each of the steps. However, in the present invention, merely by detecting the voltage at the node P1, the faulty states of the first FET 31 and second FET 32 at each of the steps can be discriminated from each other (see FIG. 4). Therefore, similarly to the first embodiment, since only the voltage at the node P1 should be detected, only one voltage sensor (voltage sensor 50) is needed.

As described so far, the second embodiment is different from the first embodiment in an approach to fault detection processing. However, similarly to the first embodiment, by executing three steps at a maximum, a short-circuit fault or disconnection fault of each of the first FET 31 and second FET 32 can be detected. Therefore, the present embodiment can, similarly to the first embodiment, quickly and reliably detect the fault, which has occurred in the power relay 30, despite a relatively simple configuration.

Other Embodiments

In the aforesaid embodiments, the charge circuit 60 applies a voltage (approximately 5 V), which is different from the supply voltage Vb (approximately 12 V) of the battery 80, to the capacitor 40, and thus charges the capacitor 40. In contrast, according to another embodiment of the present invention, the charge circuit 60 may apply a voltage (approximately 12 V), which is identical to the supply voltage Vb (approximately 12 V) of the battery 80, to the capacitor 40, and may thus charge the capacitor 40. In this case, at step 1, in which of the first FET 31 and second FET 32 a short-circuit fault has occurred cannot be discriminated, but the fact that the short-circuit fault has occurred in at least one of the first FET 31 and second FET 32 (the short-circuit fault has occurred in the power relay 30) can be detected.

The aforesaid embodiments are concerned with a case where the motor control unit is employed in controlling a three-phase brushless motor. In contrast, according to another embodiment of the present invention, the motor control unit may be employed in controlling a brushless motor other than the three-phase one. In addition, the motor control unit may be employed in controlling not only the brushless motors but also motors other than the brushless motors.

The aforesaid embodiments are concerned with a case where the motor control unit includes a drive circuit of one system (inverter). In contrast, according to another embodiment of the present invention, the motor control unit may include drive circuits of plural systems.

The aforesaid embodiments are concerned with a case where MOSFETs are used as the first switching element and second switching element constituting the power relay. In contrast, according to another embodiment of the present invention, semiconductor switching elements other than the MOSFETs may be used as the first switching element and second switching element as long as the switching elements include respective parasitic diodes.

In addition, the aforesaid embodiments are concerned with a case where the microcomputer 70 performs fault detection processing for a power relay. In contrast, according to another embodiment, an arithmetic processor such as a computer other than the microcomputer may be used to perform the fault detection processing.

According to another embodiment of the present invention, the motor control unit may be adapted to rack type electric power steering equipment that gives an assist torque to a rack shaft of a vehicle.

Further, the present invention may be applied to a motor control unit that controls a motor other than a motor included in the electric power steering equipment.

As described so far, the present invention is not limited to the aforesaid embodiments but can be applied to various forms without a departure from its gist.

The above disclosure has the following aspects.

According to a first aspect of the present disclosure, a motor control device for detecting a short-circuit fault and a disconnection fault of a power relay, includes: a drive circuit supplying a driving electric power to a motor according to a supply voltage from a power supply; the power relay disposed on a power line, which couples the power supply and the drive circuit, wherein the power relay includes a first switching element disposed on the power line so that a polarity of a parasitic diode thereof is oriented toward the power supply, and a second switching element disposed on the power line on a drive circuit side of the first switching element so that a polarity of a parasitic diode thereof is oriented toward the drive circuit, and wherein the power relay interrupts and permits a current, which flows along the power line, according to operation of the first switching element and second switching element; a capacitor having one terminal connected to the power line between the second switching element and drive circuit; a voltage detector disposed on the power line between the first switching element and the second switching element, and detecting a voltage of the first switching element on a second switching element side; a charger charging the capacitor by applying a charge voltage to the capacitor; and a control section controlling the drive circuit to control drive of the motor, controlling operation of the power relay to interrupt and permit the current, which flows along the power line, and controlling operation of the charger to charge the capacitor. The control section executes a first step for detecting a short-circuit fault of one of the first switching element and second switching element according to the voltage detected by the voltage detector in a case where the control section controls both of the first switching element and second switching element to turn off after the control section controls the charger to charge the capacitor. When the control section does not detect the short-circuit fault of both of the first switching element and second switching element in the first step, the control section executes a second step for detecting a disconnection fault of the second switching element according to the voltage detected by the voltage detector in a case where the control section controls the first switching element to turn off, and controls the second switching element to turn on. When the control section does not detect the disconnection fault of the second switching element in the second step, the control section executes a third step for detecting a disconnection fault of the first switching element according to the voltage detected by the voltage detector in a case where the control section controls the first switching element to turn on, and controls the second switching element to turn off.

In the motor control device, for example, if the voltage detected by the voltage detector at the first step is 0, the control section decides that the short-circuit fault has not occurred in either of the first switching element and second switching element constituting the power relay, that is, that the short-circuit fault has not occurred in the power relay. In contrast, if the voltage detected by the voltage detector at the first step is not 0, the control section decides that the short-circuit fault has occurred in at least one of the first switching element and second switching element constituting the power relay, that is, that the short-circuit fault has occurred in the power relay. Thus, the control section can detect the short-circuit fault of the power relay by executing the first step.

For example, if the voltage detected by the voltage detector at the second step is not 0, the control section decides that the disconnection fault has not occurred in the second switching element. In contrast, if the voltage detected by the voltage detector at the second step is 0, the control section decides that the disconnection fault has occurred in the second switching element.

For example, if the voltage detected by the voltage detector at the third step is not 0, the control section decides that the disconnection fault has not occurred in the first switching element. In contrast, if the voltage detected by the voltage detector at the third step is 0, the control section decides that the disconnection fault has occurred in the first switching element. Thus, the control section can detect the disconnection fault of the power relay by executing the second step and third step subsequently to the first step.

As mentioned above, a short-circuit fault and disconnection fault in each of the first switching element and second switching element can be detected by executing three steps at a maximum. In addition, at each of the steps, the short-circuit fault or disconnection fault of each of the switching elements can be detected by deciding whether the voltage detected by the voltage detector is 0 or other than 0. As a physical component, the charger is needed. However, only one voltage detector is needed in order to detect the short-circuit fault or disconnection fault of the power relay. Therefore, the motor control device can quickly and reliably detect the fault, which has occurred in the power relay, despite the relatively simple configuration.

Alternatively, the charge voltage may be different from the supply voltage so that the control section determines, based on the voltage detected by the voltage detector in the first step, which of the first switching element and second switching element the short-circuit fault occurs. For example, if the voltage detected by the voltage detector at the first step is a voltage equivalent to the supply voltage, a decision is made that the short-circuit fault has occurred in the first switching element. In contrast, if the voltage detected by the voltage detector at the first step is a voltage equivalent to a charge voltage applied to the capacitor, a decision is made that the short-circuit fault has occurred in the second switching element.

According to a second aspect of the present disclosure, electric power steering equipment includes: the motor control device according to the first aspect; and the motor outputting an assist torque for a steering wheel. The motor control device in accordance with the first aspect can quickly and reliably detect a fault that has occurred in the power relay. Therefore, the motor control device is preferably adapted especially to the electric power steering equipment in which control of drive of the motor has to be ceased if the fault has occurred in the power relay of the motor control unit.

According to a third aspect of the present disclosure, a motor control device for detecting a short-circuit fault and a disconnection fault of a power relay, includes: a drive circuit supplying a driving electric power to a motor according to a supply voltage from a power supply; the power relay disposed on a power line, which couples the power supply and the drive circuit, wherein the power relay includes a first switching element disposed on the power line so that a polarity of a parasitic diode thereof is oriented toward the power supply, and a second switching element disposed on the power line on a drive circuit side of the first switching element so that a polarity of a parasitic diode thereof is oriented toward the drive circuit, and wherein the power relay interrupts and permits a current, which flows along the power line, according to operation of the first switching element and second switching element; a capacitor having one terminal connected to the power line between the second switching element and drive circuit; a voltage detector disposed on the power line between the first switching element and the second switching element, and detecting a voltage of the first switching element on a second switching element side; a charger charging the capacitor by applying a charge voltage to the capacitor; and a control section controlling the drive circuit to control drive of the motor, controlling operation of the power relay to interrupt and permit the current, which flows along the power line, and controlling operation of the charger to charge the capacitor. The control section executes a first step for detecting a short-circuit fault of one of the first switching element and second switching element according to the voltage detected by the voltage detector in a case where the control section controls both of the first switching element and second switching element to turn off after the control section controls the charger to charge the capacitor. When the control section does not detect the short-circuit fault of both of the first switching element and second switching element in the first step, the control section executes a second step for detecting a disconnection fault of the first switching element according to the voltage detected by the voltage detector in a case where the control section controls the first switching element to turn on, and controls the second switching element to turn off. When the control section does not detect the disconnection fault of the first switching element in the second step, the control section executes a third step for detecting a disconnection fault of the second switching element according to the voltage detected by the voltage detector in a case where the control section controls the first switching element to turn off, and controls the second switching element to turn on.

In the above motor control device, for example, if the voltage detected by the voltage detector at the first step is 0, the control section decides that the short-circuit fault has not occurred in either of the first switching element and second switching element constituting the power relay, that is, that the short-circuit fault has not occurred in the power relay. In contrast, if the voltage detected by the voltage detector at the first step is not 0, the control section decides that the short-circuit fault has occurred in at least one of the first switching element and second switching element constituting the power relay, that is, that the short-circuit fault has occurred in the power relay. Thus, the control section can detect the short-circuit fault of the power relay by executing the first step.

For example, if the voltage detected by the voltage detector at the second step is not 0, the control section decides that the disconnection fault has not occurred in the first switching element. In contrast, if the voltage detected by the voltage detector at the second step is 0, the control section decides that the disconnection fault has occurred in the first switching element.

For example; if the voltage detected by the voltage detector at the third step is not 0, the control section decides that the disconnection fault has not occurred in the second switching element. In contrast, if the voltage detected by the voltage detector at the second step is 0, the control section decides that the disconnection fault has occurred in the second switching element. Thus, the control section can detect the disconnection fault of the power relay by executing the second step and third step subsequently to the first step.

As mentioned above, a short-circuit fault and disconnection fault in each of the first switching element and second switching element can be detected by executing three steps at a maximum. In addition, at each of the steps, the short-circuit fault or disconnection fault of each of the switching elements can be detected by deciding whether a voltage detected by the voltage detector is 0 or other than 0. As a physical component, the charger is needed. However, the number of voltage detectors needed to detect the short-circuit fault or disconnection fault of the power relay is one. Therefore, the fault having occurred in the power relay can be quickly and reliably detected despite a relatively simple configuration.

Alternatively, the charge voltage may be different from the supply voltage so that the control section determines, based on the voltage detected by the voltage detector in the first step, which of the first switching element and second switching element the short-circuit fault occurs. For example, if the voltage detected by the voltage detector at the first step is a voltage equivalent to the supply voltage, a decision is made that the short-circuit fault has occurred in the first switching element. In contrast, if the voltage detected by the voltage detector at the first step is a voltage equivalent to a charge voltage applied to the capacitor, a decision is made that the short-circuit fault has occurred in the second switching element.

According to a fourth aspect of the present disclosure, electric power steering equipment includes: the motor control device according to the third aspect; and the motor outputting an assist torque for a steering wheel. The motor control device in accordance with the third aspect can quickly and reliably detect a fault that has occurred in the power relay. Therefore, the motor control device is preferably adapted especially to the electric power steering equipment in which control of drive of the motor has to be ceased if the fault has occurred in the power relay of the motor control unit.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A motor control device for detecting a short-circuit fault and a disconnection fault of a power relay, the motor control device comprising:
a drive circuit supplying a driving electric power to a motor according to a supply voltage from a power supply;
the power relay disposed on a power line, which couples the power supply and the drive circuit, wherein the power relay includes a first switching element disposed on the power line so that a polarity of a parasitic diode thereof is oriented toward the power supply, and a second switching element disposed on the power line on a drive circuit side of the first switching element so that a polarity of a parasitic diode thereof is oriented toward the drive circuit, and wherein the power relay interrupts and permits a current, which flows along the power line, according to operation of the first switching element and second switching element;
a capacitor having one terminal connected to the power line between the second switching element and drive circuit;
a voltage detector disposed on the power line between the first switching element and the second switching element, and detecting a voltage of the first switching element on a second switching element side;

a charger charging the capacitor by applying a charge voltage to the capacitor; and a control section controlling the drive circuit to control drive of the motor, controlling operation of the power relay to interrupt and permit the current, which flows along the power line, and controlling operation of the charger to charge the capacitor, wherein the control section executes a first step for detecting a short-circuit fault of one of the first switching element and second switching element according to the voltage detected by the voltage detector in a case where the control section controls both of the first switching element and second switching element to turn off after the control section controls the charger to charge the capacitor, wherein, when the control section does not detect the short-circuit fault of both of the first switching element and second switching element in the first step, the control section executes a second step for detecting a disconnection fault of the second switching element according to the voltage detected by the voltage detector in a case where the control section controls the first switching element to turn off, and controls the second switching element to turn on, and wherein, when the control section does not detect the disconnection fault of the second switching element in the second step, the control section executes a third step for detecting a disconnection fault of the first switching element according to the voltage detected by the voltage detector in a case where the control section controls the first switching element to turn on, and controls the second switching element to turn off.

2. The motor control device according to claim 1, wherein the charge voltage is different from the supply voltage so that the control section determines, based on the voltage detected by the voltage detector in the first step, which of the first switching element and second switching element the short-circuit fault occurs.

3. Electric power steering equipment comprising:
the motor control device according to claim 1; and
the motor outputting an assist torque for a steering wheel.

4. A motor control device for detecting a short-circuit fault and a disconnection fault of a power relay, the motor control device comprising:

a drive circuit supplying a driving electric power to a motor according to a supply voltage from a power supply;

the power relay disposed on a power line, which couples the power supply and the drive circuit, wherein the power relay includes a first switching element disposed on the power line so that a polarity of a parasitic diode thereof is oriented toward the power supply, and a second switching element disposed on the power line on a drive circuit side of the first switching element so that a polarity of a parasitic diode thereof is oriented toward the drive circuit, and wherein the power relay interrupts and permits a current, which flows along the power line, according to operation of the first switching element and second switching element;

a capacitor having one terminal connected to the power line between the second switching element and drive circuit;

a voltage detector disposed on the power line between the first switching element and the second switching element, and detecting a voltage of the first switching element on a second switching element side;

a charger charging the capacitor by applying a charge voltage to the capacitor; and a control section controlling the drive circuit to control drive of the motor, controlling operation of the power relay to interrupt and permit the current, which flows along the power line, and controlling operation of the charger to charge the capacitor, wherein the control section executes a first step for detecting a short-circuit fault of one of the first switching element and second switching element according to the voltage detected by the voltage detector in a case where the control section controls both of the first switching element and second switching element to turn off after the control section controls the charger to charge the capacitor, wherein, when the control section does not detect the short-circuit fault of both of the first switching element and second switching element in the first step, the control section executes a second step for detecting a disconnection fault of the first switching element according to the voltage detected by the voltage detector in a case where the control section controls the first switching element to turn on, and controls the second switching element to turn off, and wherein, when the control section does not detect the disconnection fault of the first switching element in the second step, the control section executes a third step for detecting a disconnection fault of the second switching element according to the voltage detected by the voltage detector in a case where the control section controls the first switching element to turn off, and controls the second switching element to turn on.

5. The motor control device according to claim 4, wherein the charge voltage is different from the supply voltage so that the control section determines, based on the voltage detected by the voltage detector in the first step, which of the first switching element and second switching element the short-circuit fault occurs.

6. Electric power steering equipment comprising:
the motor control device according to claim 4; and
the motor outputting an assist torque for a steering wheel.

* * * * *